(12) United States Patent
Chen et al.

(10) Patent No.: US 7,655,872 B2
(45) Date of Patent: Feb. 2, 2010

(54) THROUGH-HOLE ARRANGEMENT FOR A BALL GRID ARRAY PACKAGE

(75) Inventors: Chun-Hung Chen, Hsinchu (TW); Yi-Hsin Peng, Hsinchu (TW)

(73) Assignee: Via Technologies, Inc., Hsin-Tien, Taipei Hsien (TW)

( * ) Notice: Subject to any disclaimer, the term of this patent is extended or adjusted under 35 U.S.C. 154(b) by 621 days.

(21) Appl. No.: 11/440,009

(22) Filed: May 25, 2006

(65) Prior Publication Data

US 2006/0266550 A1    Nov. 30, 2006

(30) Foreign Application Priority Data

May 27, 2005    (TW) .............................. 94117431 A

(51) Int. Cl.
*H01R 12/04* (2006.01)
*H05K 1/11* (2006.01)
(52) U.S. Cl. ...................................... 174/262; 361/792
(58) Field of Classification Search ......... 361/792–795; 174/260–266
See application file for complete search history.

(56) References Cited

U.S. PATENT DOCUMENTS 7,405,473 B1 *    7/2008    Shi et al. ..................... 257/698
7,405,474 B1 *    7/2008    Brophy ........................ 257/700

\* cited by examiner

*Primary Examiner*—Jeremy C Norris
(74) *Attorney, Agent, or Firm*—Birch, Stewart, Kolasch & Birch, LLP

(57) ABSTRACT

The through holes in an array manner in the signal layer within the chip-interposed region on a substrate of a BGA package comprise a ball pads array having a plurality of ball pads and a vias array. The vias array has a plurality of vias located interlaces with the ball pads array. The outermost portions of the chip-interposed region are designed in such a manner to have at least two rings of vias for signal transmission and power connection. The interval between every two adjacent vias in the ring is not less than twice of the distance of two ball pads. Upon such an arrangement, the BGA package can have a plurality of dissipation channels that can increase dissipation space, dissipate quickly the heat generated from the IC, and transmit well for signal and power.

4 Claims, 6 Drawing Sheets

THROUGH-HOLE ARRANGEMENT FOR A BALL GRID ARRAY PACKAGE

FIELD OF THE INVENTION

The present invention relates to a ball grid array package, and more particularly to a ball grid array package that has a design of arranging through holes in the IC chip-interposed region for dissipating heat effectively.

BACKGROUND OF THE INVENTION

There exist several types of semiconductor device packages already in the market, in which one of them is a ball grid array package. The ball grid array package is generally used to form high I/O connections among dense electronic components and electronic circuits. Due to rapid advance of the fabrication technology, a current ball grid array package may have several thousands of driving and driven elements.

The increase in number of electronic components within a unit of the mounting surface results in narrowing of the circuits in width, which, in turn, may result in high heat resistance in the circuits. In the case that the heat generated by these components within the semiconductor device package cannot be dissipated effectively, the service life of the semiconductor device package would be definitely shortened.

FIG. 1 shows a conventional ball grid array package (a multi-layer member) to include two signal plane layers 2, a ground plane layer 4 and a power plane layer 6. In order to prevent signal interference between conductive patterns, insulated layers 8 and 10 are interposed to separate the signal plane layers 2, the ground plane layer 4 and the power plane layer 6. For example, the insulated layers 8 and 10 may be made of glass fibers, an FR4 standard laminate or an epoxy resin. As illustrated in FIG. 2, the ball grid array package defines a chip-interposed region 14 at a central portion thereof for receiving an integrated chip.

In general, the through holes 12 can be fabricated within the chip-interposed region 14 in an array manner. FIG. 2 shows typical positions of the through holes 12 in the ground plane layer. The outermost portion of the chip-interposed region 14 is designed in such a manner to have at least a ring of through holes 12 for signal transmission between the signal plane layers and the power connection. The inner portion of the chip-interposed region 14 is designed for connection with the ground and power plane layers. Upon such an arrangement, the outermost ring of through holes 12 in the chip-interposed region 14 of the ground plane layer disposes a plurality of clearance of the through holes in order to insulate the through holes 12 and the ground plane layer. It is noted that the clearances of the through holes (or the clearance of vias) can be formed by etching the ground plane layer. In the etching process, copper foil layers (signal and ground layers) may have manufacture error (non-uniform clearance) in locations of the holes, and thus the heat-dissipation path along the copper material between any two adjacent holes is quite possible to be deformed by possible error locations of the holes.

The circuits within the chip-interposed region 14 in the conventional ball grid array package 16 are so densely located and since the heat dissipating paths may be somehow interrupted by the presence of the clearances of through holes at the outermost ring portion of the chip-interposed region 14, the heat generated in the conventional ball grid array package 16 may be dissipated ineffectively to the exterior via the ground plane layer. In addition, the densely locations of the through holes 12 may minimize the surface area of the ground plane layer and thus consequently affect the effective paths of the GND to the chip, which will thereby decrease the signal quality.

FIG. 3 shows the position of the through holes within the chip-interposed region in the power plane layer with respect to that shown in FIG. 2. The clearances of through holes 12 in the outermost ring of the chip-interposed region 14 of FIG. 2 serve as the conductive through holes in the power plane layer in FIG. 3.

SUMMARY OF THE PRESENT INVENTION

In the present invention, the array manner of the through holes in the signal layer within the chip-interposed region on the substrate of the BGA package can comprise an array of ball pads further having a plurality of ball pads and an array of vias further having a plurality of vias to interlace with the ball pads array. The outermost portions of the chip-interposed region are designed in such a manner to have at least two rings of vias for signal transmission and power connection. At least two ball pads are disposed between two adjacent vias in each of the rings.

In the present invention, the array manner of the through holes in the ground layer within the chip-interposed region on substrate of BGA package can comprise an array of conductive vias further having a plurality of conductive vias. At least two rings of vias are located on outside of the conductive vias array, and each ring of two rings comprises a plurality of clearances of through holes. Every two adjacent clearances of through holes are spaced by an interval of a width of one conductive via at least. The array of vias is further divided into two parts. One part is an inner array and another part includes two outer rings of vias. The interval between two adjacent vias in each of two rings is double to that between two adjacent vias in the inner array.

DETAILED DESCRIPTION OF THE PREFERRED EMBODIMENT

The method of the present invention provides a design for arranging through holes in the IC chip-interposed region in the light of defects of prior art. It improves the heat dissipation loop to resolve effectively the aforesaid problems in the conventional through hole arrangement.

Figure 1:
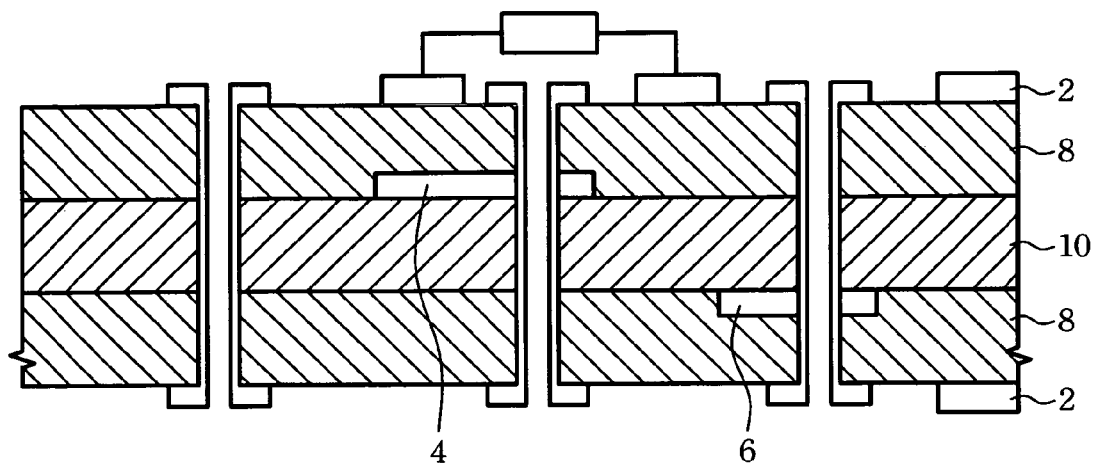
FIG. 1 is a cross-section diagram of a substrate of a conventional BGA package.
Figure 2:
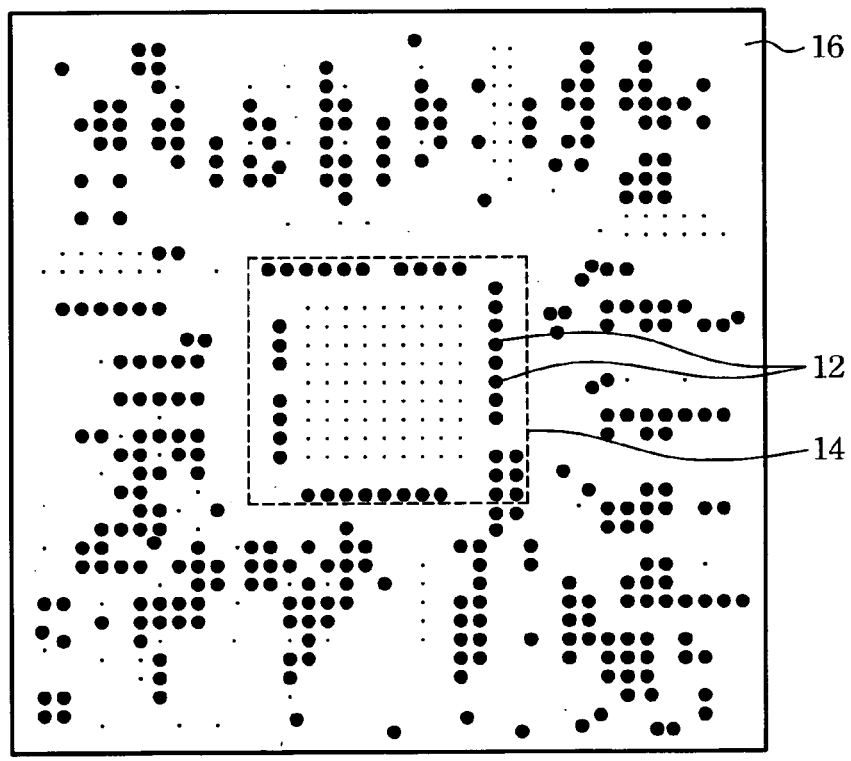
FIG. 2 is a top view of a typical ground plane layer of the conventional BGA package.
Figure 3:
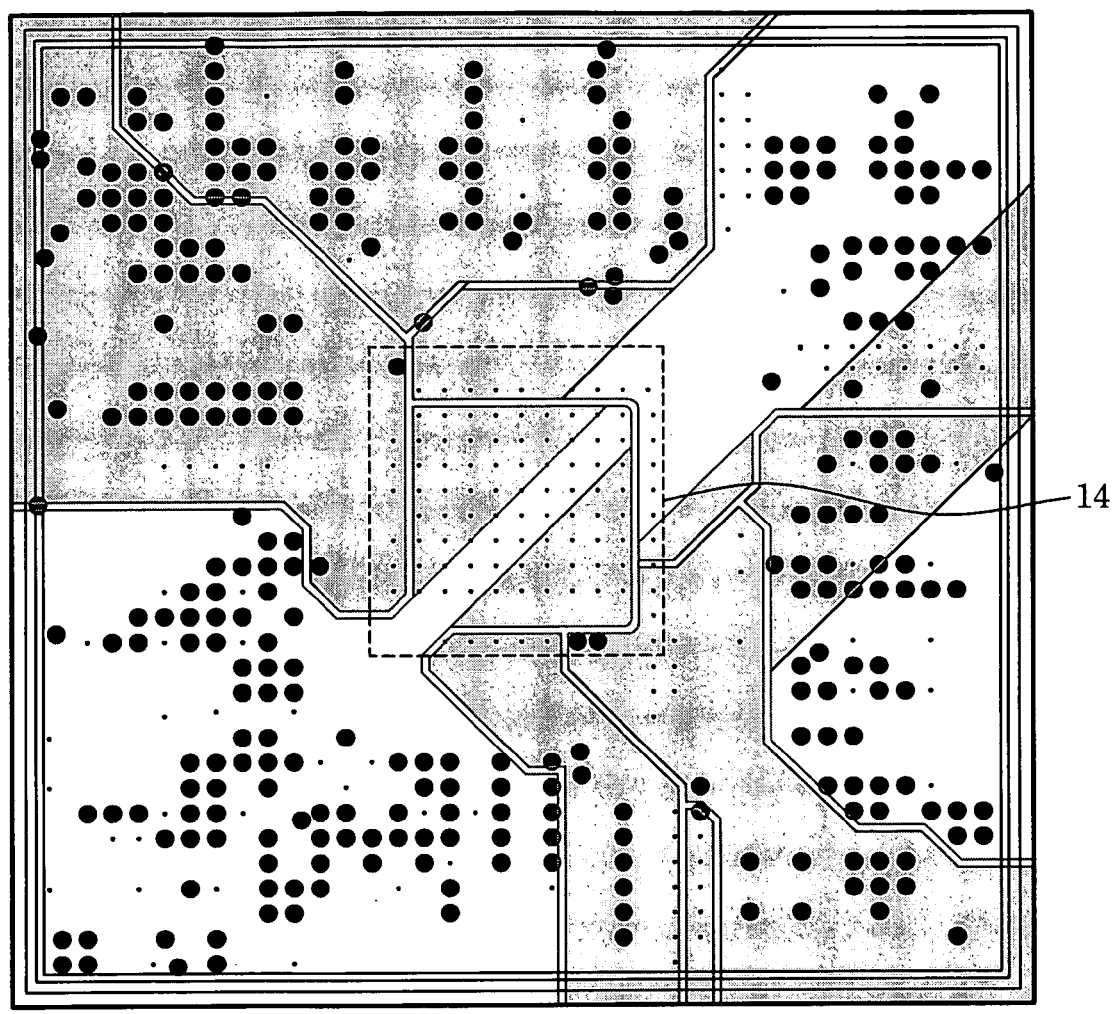
FIG. 3 is a top view of a typical power layer of the conventional BGA package.
Figure 4:
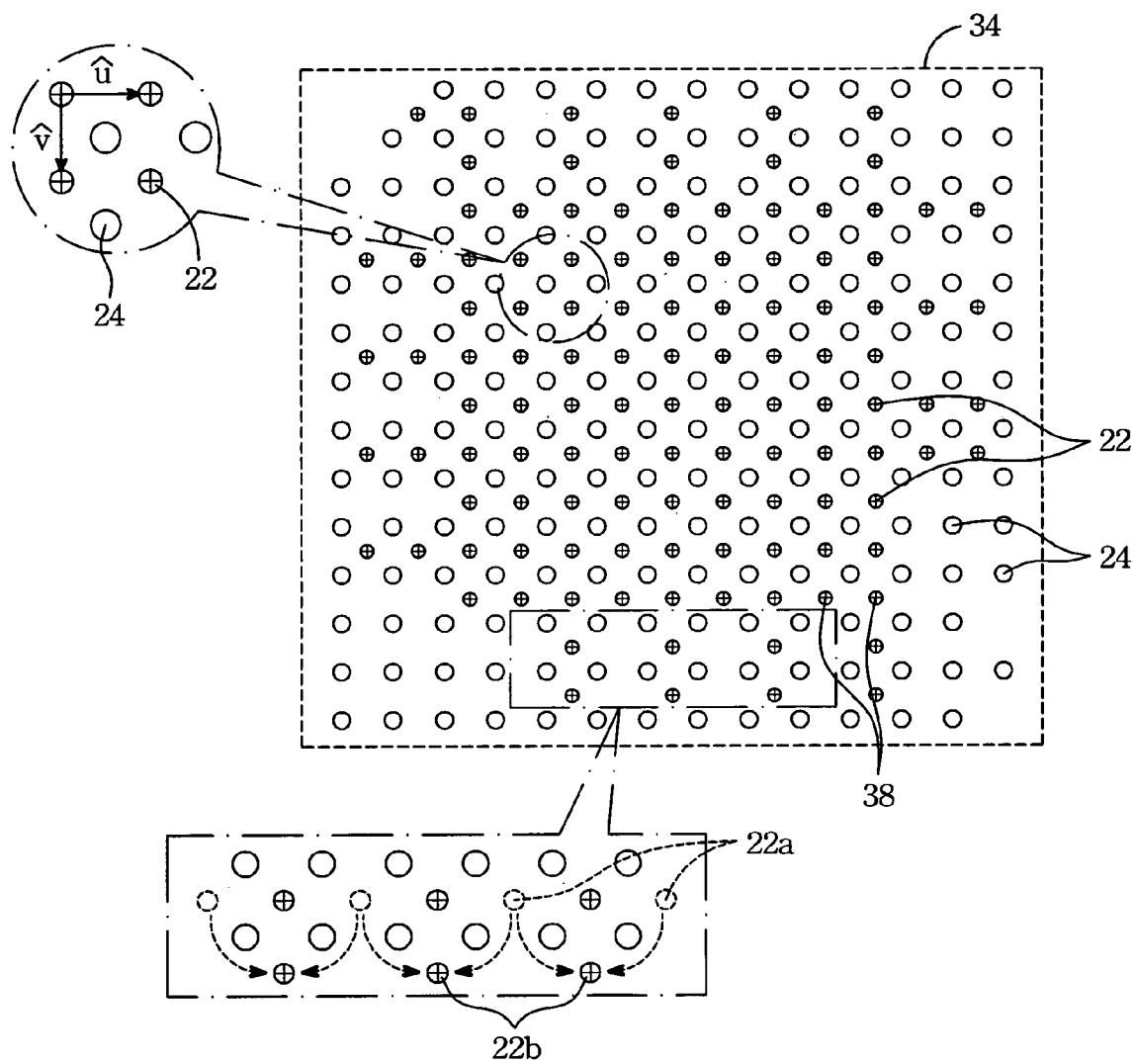
FIG. 4 is a top view of a signal plane layer in a substrate of a preferred BGA package in accordance with the present invention.

A first embodiment of the present invention is applied to an IC chip-interposed region in a signal plane layer of a BGA. FIG. 4 shows the IC chip-interposed region 34 comprising a vias array 22 (i.e. the through holes array) and a ball pads array 24. The ball pads array 24 is shift ½ u, ½ v in relation to the through holes array 22. The unit u is the distance of adjacent vias in row, and the unit v is the distance of adjacent vias in column. As shown in a pop-out enlarged figure lower in FIG. 4, if the vias pair 22a of the sub-outermost ring in the vias array 22 are shifted by a unit (1 u, 1 v) or (−1 u, 1 v), they would hit the positions that locating the pair 22b in the outermost rings of the vias array 22.

The outermost portion of the vias array 22 is designed in such a manner to have at least two rings of vias for signal transmission and power connection. The interval between every two adjacent vias in the ring is equal to or larger than twice of the distance of two ball pads. The other vias of the vias array are designed for ground connection or power connection. The vias filled with a conductive material are called conductive vias 38 and are used to connect with pattern of the power layer, the ground layer, and the signal layer located exterior to the IC chip-interposed region 34 for transmitting signals between the IC chip and the substrate.

Figure 5:
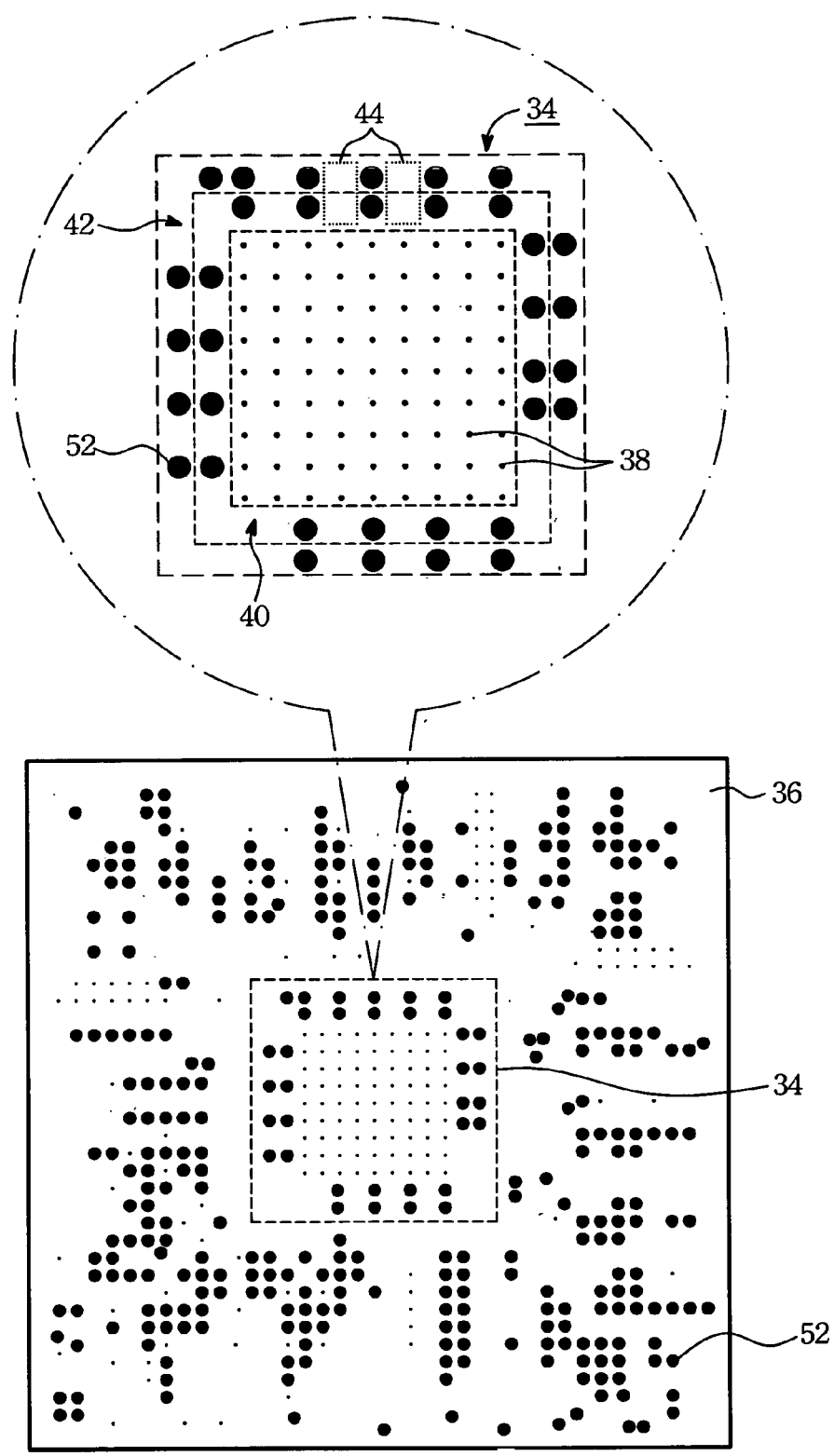
FIG. 5 is a top view of a ground plane layer in the substrate of the preferred BGA package in accordance with the present invention.

FIG. 5 shows the embodiment of a ground plane layer of a BGA in accordance with the present invention. The center of the ground layer 36 has an IC chip-interposed region 34, which is overlapping the IC chip-interposed region 34 of the signal layer, to connect electrically with the IC chip. The two rings 40, 42 of IC chip-interposed region 34 may comprise the clearances of through holes 52, which is to insulate the corresponding via of the vias array 22 and the ground plane 36.

The two outermost rings 40, 42 of IC chip-interposed region 34 in ground layer are located corresponding to the vias array of IC chip-interposed region 34 in the signal layer. Every two adjacent clearances of through holes 52 in the ring of vias are spaced by one conductive via 38 at least. Then, a plurality of channels 44 as well as enough dissipation space can be provided to the ground layer. As FIG. 5 shows, in the first embodiment of the present invention, the clearances of through holes on the outermost ring are paralleled with the clearances of through holes on the sub-outermost ring.

The outermost portion of the chip-interposed region is arranged in such a manner to have at least two rings of the vias, and thereby the heat dissipation loops can be improved over the prior art design that includes dense clearances of through holes at the outermost portion of the chip-interposed region. A plurality of channels can dissipate the heat generated by functioning the IC chip effectively and thus resolve the problem of the deposited heat degrading the BGA efficiency. In addition, the existence of channels can also increase the loop area so as to decrease the possibility of signals being interrupted by the clearances of through holes, and thus the signal transmission quality especial for high-speed signals can be ensured.

Figure 6:
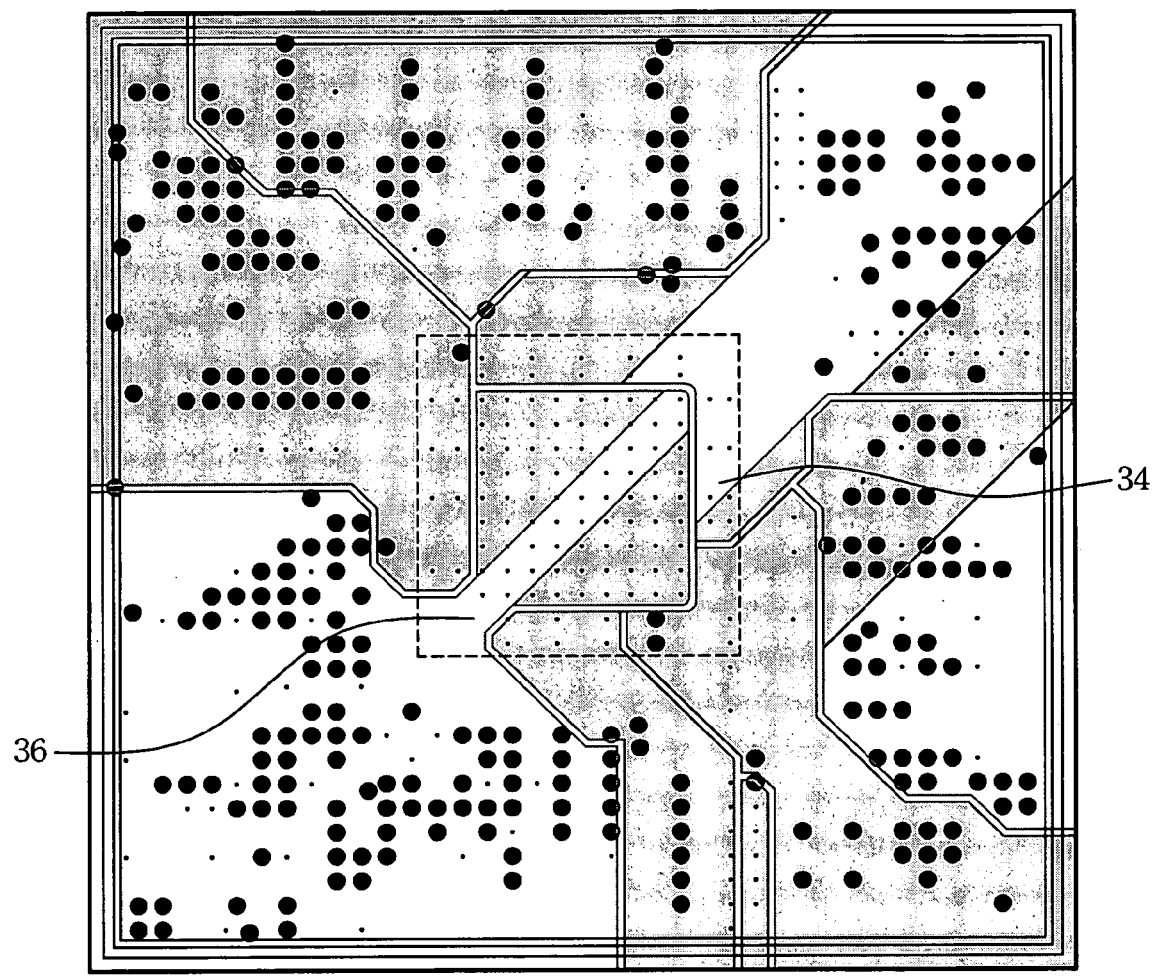
FIG. 6 is a top view of a power plane layer in the substrate of the preferred BGA package in accordance with the present invention.

The outermost portion of the chip-interposed region in the signal layer is changed in such a manner to have at least two rings of vias, and then the two outermost rings of the chip-interposed region in the power layer change accordingly with respect to the signal layer. FIG. 6 shows a diagram of a power plane layer in the substrate of the BGA in accordance with the present invention. The outermost portion of the chip-interposed region 34 is designed in such a manner to have at least two rings of vias for signal transmission and power connection, and so the majority of the conductive vias in FIG. 6 are accounted to the clearances of through holes in FIG. 5.

Figure 7:
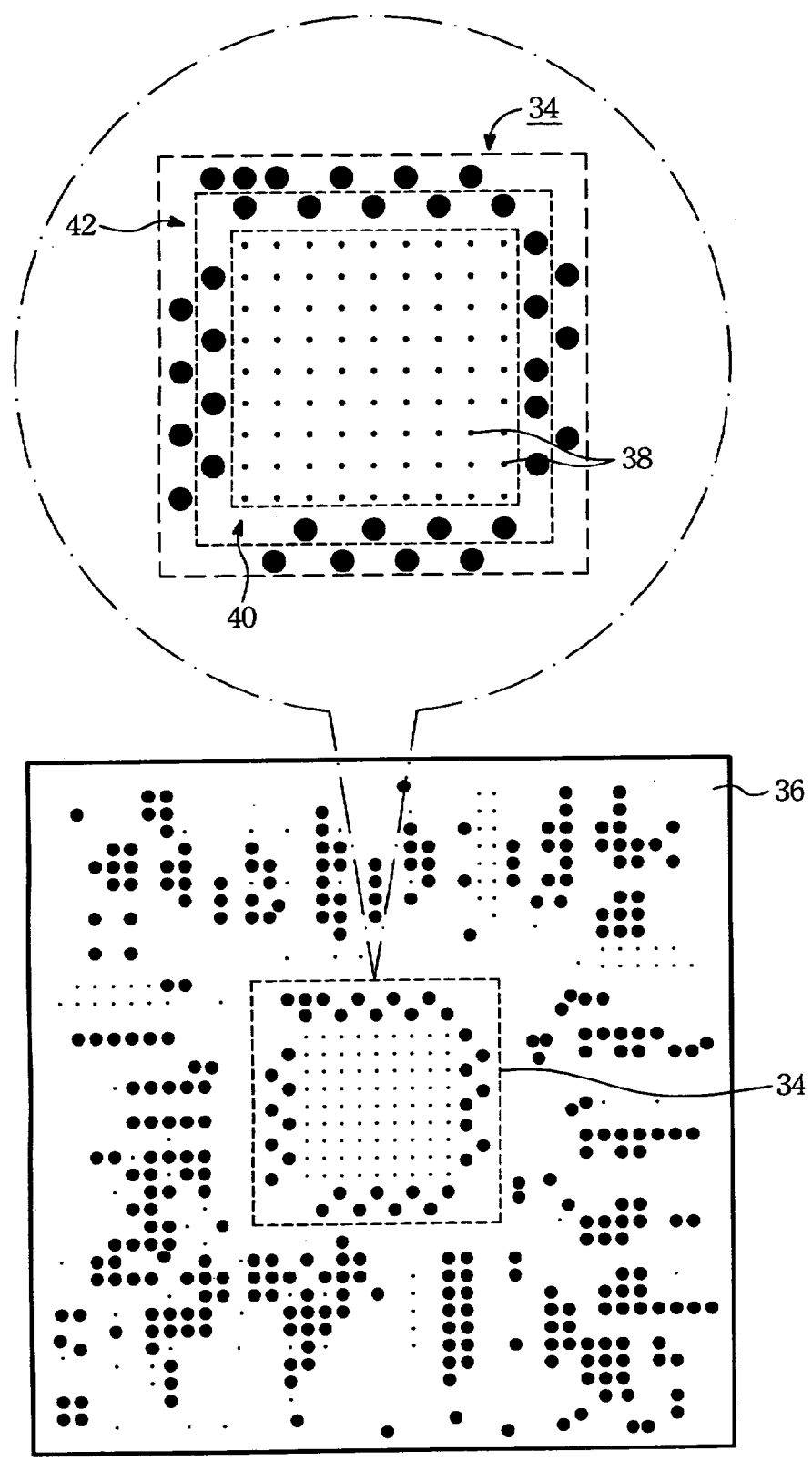
FIG. 7 is a top view of a ground plane layer in a substrate of another BGA package in accordance with the present invention.

FIG. 7 shows the second embodiment of the IC chip-interposed region in the ground plane layer of the BGA in accordance with the present invention. The center of the ground (metal) layer 36 has an IC chip-interposed region 34, located at a position related to the IC chip-interposed region of the signal layer, to connect electrically with the IC chip. The IC chip-interposed region 34 comprises a conductive vias array 38 in the middle, and two outermost rings 40, 42 corresponding to the vias array in the signal plane layer.

In the present invention, the through holes of the outermost rings 40, 42 are arranged in a predetermined discrete manner no so to generate substantially heat dissipation spaces in between. As shown in FIG. 7, the clearances of through holes (or the clearances of vias) on the two rings 40, 42 are arranged, as shown, to form the predetermined discrete manner of a saw-tooth shape. The array manner provides the heat dissipation space in the ground plane layer and thus helps to dissipate the heat laterally and effectively. Every two adjacent clearances of through holes in the ring are spaced between two adjacent clearances of through holes by one conductive via at least.

According to the first and second embodiments, the predetermined discrete manner can be a manner of a parallel array, a saw-tooth shape, or one partly in a parallel array and partly in a sea-tooth shape.

The invention has been described in detail with reference to particular illustrative embodiments. It is understood that variations and modifications of the invention can be effected within the spirit and scope of the invention and as defined in the appended claims.

What is claimed is:

1. A substrate of ball grid array package, comprising:
    a first signal layer formed successively thereon a first insulating layer, a power layer, a second insulating layer, a ground layer, a third insulating layer, and a second signal layer,
    wherein said substrate has a chip-interposed region having an array of vias and an array of ball pads formed on said first signal layer and said second signal layer, and said array of vias are arranged mutually shifted with said array of ball pads by ½u, and ½v, said u and v being a distance between two adjacent columns and a distance between two adjacent rows of said vias, respectively, in said chip-interposed region except an outmost ring and a sub-outmost ring; and
    wherein said distance between two adjacent columns and said distance between two adjacent rows of vias at the outmost ring is double at least at a right hand side or a left hand side of said vias; and said distance between two adjacent columns and said distance between two adjacent rows of vias at the sub-outmost ring is double at least at a right hand side or a left hand side of said vias so as to provide more heat dissipation areas at the outmost ring and the sub-outmost ring than an inner portion of said chip-interposed region; and
    wherein said vias at the outmost ring and the sub-outmost ring within said chip-interposed region are filled with conductive material but provided as clearances of through holes at said power layer so that said clearances of through holes are electrically disconnected with both of said power layer and said first and said second signal layers.

2. The substrate of claim 1, wherein said first signal layer power layer, ground layer, and a second signal layer are formed thereon with conductive trace patterns, respectively.

3. The substrate of claim 1, wherein said vias at the outmost ring are displaced one unit of said distance with said vias at the sub-outmost ring.

4. The substrate of claim 1, wherein said vias at the outmost ring are aligned with said vias at the sub-outmost ring so that said vias at the outmost ring are in parallel with said vias at the sub-outmost ring.

* * * * *

UNITED STATES PATENT AND TRADEMARK OFFICE
CERTIFICATE OF CORRECTION

PATENT NO. : 7,655,872 B2  Page 1 of 1
APPLICATION NO. : 11/440009
DATED : February 2, 2010
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 874 days.

Signed and Sealed this

Thirtieth Day of November, 2010

David J. Kappos
*Director of the United States Patent and Trademark Office*